(12) United States Patent
Qian et al.

(10) Patent No.: US 10,885,999 B2
(45) Date of Patent: Jan. 5, 2021

(54) SHIFT REGISTER, METHOD FOR CONTROLLING THE SAME, GATE DRIVING CIRCUIT AND DISPLAY APPARATUS

(71) Applicants: BOE Technology Group Co., Ltd., Beijing (CN); HEFEI XINSHENG OPTOELECTRONICS TECHNOLOGY CO., LTD., Anhui (CN)

(72) Inventors: Xianrui Qian, Beijing (CN); Yuting Chen, Beijing (CN); Fei Li, Beijing (CN); Bo Li, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 179 days.

(21) Appl. No.: 16/120,869

(22) Filed: Sep. 4, 2018

(65) Prior Publication Data
US 2019/0214104 A1 Jul. 11, 2019

(30) Foreign Application Priority Data
Jan. 8, 2018 (CN) .......................... 2018 1 0015696

(51) Int. Cl.
*G11C 19/00* (2006.01)
*G11C 19/28* (2006.01)
(Continued)

(52) U.S. Cl.
CPC ............... *G11C 19/28* (2013.01); *G09G 3/20* (2013.01); *G09G 3/3677* (2013.01);
(Continued)

(58) Field of Classification Search
None
See application file for complete search history.

(56) References Cited

U.S. PATENT DOCUMENTS

| 2008/0219401 A1* | 9/2008 | Tobita | ................... G09G 3/3677 377/79 |
| 2014/0086379 A1* | 3/2014 | Ma | .......................... G11C 19/28 377/64 |

(Continued)

*Primary Examiner* — Tuan T Lam
(74) *Attorney, Agent, or Firm* — Westman, Champlin & Koehler, P.A.

(57) ABSTRACT

The embodiments of the present application provide a shift register, a method for controlling the same, a gate driving circuit, and a display apparatus. The shift register includes: an input circuit coupled to a signal input terminal and a pull-up node; a pull-up circuit coupled to the pull-up node, a first clock signal terminal and a signal output terminal; a pull-down circuit coupled to a reset signal terminal, a first voltage signal terminal, the pull-up node, and the signal output terminal; a pull-down control circuit coupled to a second clock signal terminal, the pull-up node, a pull-down node, and the first voltage signal terminal; a first de-noising circuit coupled to the pull-up node, the signal input terminal, the first voltage signal terminal, and a compensation node; and a compensation circuit coupled to the first clock signal terminal, the second clock signal terminal, and the compensation node.

12 Claims, 6 Drawing Sheets

(51) Int. Cl.
*G09G 3/20* (2006.01)
*G09G 3/36* (2006.01)

(52) U.S. Cl.
CPC ............... *G09G 2300/043* (2013.01); *G09G 2300/0809* (2013.01); *G09G 2310/0286* (2013.01); *G09G 2310/08* (2013.01)

(56) References Cited

U.S. PATENT DOCUMENTS

| | | | |
|---|---|---|---|
| 2015/0043703 A1* | 2/2015 | Tan | G11C 19/28 377/68 |
| 2016/0351109 A1* | 12/2016 | Han | G09G 3/20 |
| 2018/0122321 A1* | 5/2018 | Qian | G09G 3/3677 |
| 2018/0293924 A1* | 10/2018 | Wang | G09G 3/20 |
| 2019/0096350 A1* | 3/2019 | Zhao | G09G 3/3677 |
| 2019/0139616 A1* | 5/2019 | Qian | G11C 19/28 |
| 2019/0251921 A1* | 8/2019 | Ono | G09G 3/20 |

\* cited by examiner

50

| In a first phase, a second capacitor in the compensation circuit is charged by the first clock signal under the control of the first clock signal, to cause the voltage at the compensation node to be a charging voltage of the second capacitor, so that a voltage applied by the compensation circuit to the first de-noising circuit is greater than a threshold voltage of the de-noising circuit | S501 |

| In a second phase, the second capacitor is discharged under the control of the second clock signal, until a voltage difference across the second capacitor decreases to the threshold voltage | S502 |

| In a third phase, the voltage at the compensation node is caused to be a sum of a voltage of the first clock signal and the voltage difference across the second capacitor under the control of the first clock signal, so that the voltage applied by the compensation circuit to the first de-noising circuit is a sum of the voltage of the first clock signal and the threshold voltage | S503 |

Fig. 5A

Display apparatus 10000

Gate driving circuit 1000

Fig. 7

SHIFT REGISTER, METHOD FOR CONTROLLING THE SAME, GATE DRIVING CIRCUIT AND DISPLAY APPARATUS

CROSS-REFERENCE TO RELATED APPLICATION(S)

This application claims priority to the Chinese Patent Application No. 201810015696.3, filed on Jan. 8, 2018, which is incorporated herein by reference in its entirety.

TECHNICAL FIELD

The embodiments of the present disclosure relate to the field of gate driving technologies, and more particularly, to a shift register, a gate driving circuit, a display apparatus, and a method for controlling a shift register.

BACKGROUND

A Gate Driver on Array (GOA) circuit has advantages such as a low cost, a narrow bezel, and simple processing etc. As a basic principle of an operation of the GOA circuit is to progressively transmit a signal from a previous row to a next row, the stability of a logic circuit is particularly important in the design of the entire GOA circuit. Once a row of signals is unstable due to noises, it may be transmitted progressively, and there is a possibility that an abnormal signal is amplified, which results in a distortion of a driving signal provided by the GOA circuit, thereby causing abnormal display of a display apparatus.

SUMMARY

According to an aspect of the embodiments of the present disclosure, there is proposed a shift register, comprising: an input circuit coupled electronically to a signal input terminal and a pull-up node, and configured to apply a voltage at the signal input terminal to the pull-up node under a control of an input signal provided by the signal input terminal; a pull-up circuit coupled electronically to the pull-up node, a first clock signal terminal and a signal output terminal, and configured to apply a voltage at the first clock signal terminal to the signal output terminal under a control of a voltage at the pull-up node; a pull-down circuit coupled electronically to a reset signal terminal, a first voltage signal terminal, the pull-up node, and the signal output terminal, and configured to apply a voltage at the first voltage signal terminal to the signal output terminal and the pull-up node under a control of a voltage at the reset signal terminal; a pull-down control circuit coupled electronically to a second clock signal terminal, the pull-up node, a pull-down node, and the first voltage signal terminal, and configured to apply a voltage at the second clock signal terminal to the pull-down node under a control of a clock signal provided by the second clock signal terminal, and apply the voltage at the first voltage signal terminal to the pull-down node under the control of the voltage at the pull-up node; a first de-noising circuit coupled electronically to the pull-up node, the signal input terminal, the first voltage signal terminal, the output signal terminal, and a compensation node, and configured to perform de-noising processing on an output signal at the signal output terminal; and a compensation circuit coupled electronically to the first clock signal terminal, the second clock signal terminal, the compensation node, and the first voltage signal terminal, and configured to simulate a drift of a threshold voltage for a transistor in the first de-noising circuit according to clock signals provided by the first clock signal terminal and the second clock signal terminal, so as to compensate for the threshold voltage of the transistor.

In an example, the shift register further comprises: a second de-noising circuit coupled electronically to the pull-down node, the pull-up node, the first voltage signal terminal, and the signal output terminal, and configured to de-noise the output signal at the signal output terminal according to the voltage at the pull-up node under a control of a voltage at the pull-down node.

In an example, the pull-up circuit comprises: a first transistor having a control electrode coupled electronically to the pull-up node, a first electrode coupled electronically to the signal output terminal, and a second electrode coupled electronically to the first clock signal terminal; and a first capacitor having a first terminal coupled electronically to the pull-up node, and a second terminal coupled electronically to the signal output terminal.

In an example, the first de-noising circuit comprises: a second transistor having a control electrode coupled electronically to the compensation node, a first electrode coupled electronically to the first voltage signal terminal, and a second electrode coupled electronically to the signal output terminal; and a third transistor having a control electrode coupled electronically to the compensation node, a first electrode coupled electronically to the pull-up node, and a second electrode coupled electronically to the signal input terminal.

In an example, the compensation circuit comprises: a fourth transistor having a control electrode and a first electrode coupled electronically to the compensation node, and a second electrode coupled electronically to the second clock signal terminal; a second capacitor having a first terminal coupled electronically to the compensation node, and a second terminal coupled electronically to the second clock signal terminal; a fifth transistor having a control electrode and a first electrode coupled electronically to the first clock signal terminal, and a second electrode coupled electronically to the compensation node; and a sixth transistor having a control electrode coupled electronically to the first clock signal terminal, a first electrode coupled electronically to the first voltage signal terminal, and a second electrode coupled electronically to the second clock signal terminal.

In an example, channel width to length ratios of the fourth transistor, the fifth transistor, and the sixth transistor are defined so that the voltage at the compensation node is greater than a threshold voltage of the second transistor and a threshold voltage of the third transistor in the first de-noising circuit while the second capacitor being charged.

In an example, the second de-noising circuit comprises: a seventh transistor having a control electrode coupled electronically to the pull-down node, a first electrode coupled electronically to the first voltage signal terminal, and a second electrode coupled electronically to the signal output terminal; and an eighth transistor having a control electrode coupled electronically to the pull-down node, a first electrode coupled electronically to the first voltage signal terminal, and a second electrode coupled electronically to the pull-up node.

In an example, the pull-down control circuit comprises: a ninth transistor having a control electrode and a first electrode both coupled electronically to the second clock signal terminal, and a second electrode coupled electronically to the pull-down control node; a tenth transistor having a control electrode coupled electronically to the pull-down control node, a first electrode coupled electronically to the second clock signal terminal, and a second electrode coupled electronically to the pull-down node; an eleventh transistor having a control electrode coupled electronically to the pull-up node, a first electrode coupled electronically to the first voltage signal terminal, and a second electrode coupled electronically to the pull-down node; and a twelfth transistor having a control electrode coupled electronically to the pull-up node, a first electrode coupled electronically to the first voltage signal terminal, and a second electrode coupled electronically to the pull-down control node.

In an example, the pull-down circuit comprises: a thirteenth transistor having a control electrode coupled electronically to the reset signal terminal, a first electrode coupled electronically to the first voltage signal terminal, and a second electrode coupled electronically to the signal output terminal; and a fourteenth transistor having a control electrode coupled electronically to the reset signal terminal, a first electrode coupled electronically to the first voltage signal terminal, and a second electrode coupled electronically to the pull-up node.

In an example, the input circuit comprises: a fifteenth transistor having a control electrode coupled electronically to the signal input terminal, a first electrode coupled electronically to the pull-up node, and a second electrode coupled electronically to the control electrode of the fifteenth transistor.

According to another aspect of the embodiments of the present disclosure, there is proposed a gate driving circuit, comprising the shift register according to the embodiments of the present disclosure.

According to yet another aspect of the embodiments of the present disclosure, there is proposed a display apparatus, comprising the gate driving circuit according to the embodiments of the present disclosure.

According to still another aspect of the embodiments of the present disclosure, there is proposed a method for controlling the shift register according to the embodiments of the present disclosure, comprising: charging, in a first phase, a second capacitor in the compensation circuit by a first clock signal under a control of the first clock signal, to cause a voltage at the compensation node to be a charging voltage of the second capacitor, so that a voltage applied by the compensation circuit to the first de-noising circuit is greater than a threshold voltage of the de-noising circuit; discharging, in a second phase, the second capacitor under a control of a second clock signal, until a voltage difference across the seco
nd capacitor falls to the threshold voltage; and causing, in a third phase, the voltage at the compensation node to be a sum of a voltage of the first clock signal and the voltage difference across the second capacitor under the control of the first clock signal, so that the voltage applied by the compensation circuit to the first de-noising circuit is a sum of the voltage of the first clock signal and the threshold voltage.

BRIEF DESCRIPTION OF THE ACCOMPANYING DRAWINGS

FIG. 5A illustrates a flowchart of a method for controlling a shift register according to an embodiment of the present disclosure;

FIG. 7 illustrates a block diagram of a display apparatus according to an embodiment of the present disclosure.

DETAILED DESCRIPTION

Figure 1:
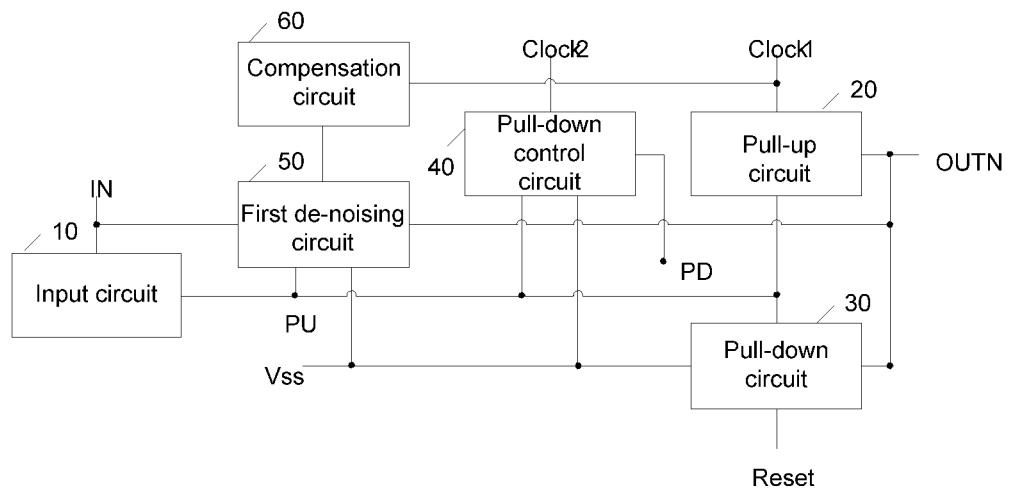
FIG. 1 illustrates a block diagram of a shift register according to an embodiment of the present disclosure.

The embodiments of the present disclosure will be described in detail below, and examples of the embodiments are illustrated in the accompanying drawings, throughout which the same or similar reference signs are used to refer to the same or similar elements or elements having the same or similar functions. The embodiments described below with reference to the accompanying drawings are illustrative and are intended to explain the embodiments of the present disclosure, rather than being construed as limiting the embodiments of the present disclosure.

A shift register, a de-noising control method thereof, a gate driving circuit, and a display apparatus according to the embodiments of the present disclosure will be described below with reference to the accompanying drawings.

In order to achieve a de-noising function of a GOA circuit, a de-noising transistor is typically added to the GOA circuit. For example, in the GOA circuit, a de-noising transistor is provided at an input terminal and an output terminal of a shift register, and a gate of the de-noising transistor is coupled electronically to a clock signal terminal, thereby achieving the purpose of direct de-noising by writing a clock signal to the gate of the de-noising transistor. However, due to a long-term influence on the de-noising transistor by the clock signal, the de-noising transistor has a severe drift of a threshold voltage, which influences the stability of the GOA circuit and a display effect of a display apparatus.

Technical or scientific terms used in the embodiments of the present disclosure should be of ordinary meaning as understood by those skilled in the art, unless otherwise defined. The terms "first", "second" and similar words used in the embodiments of the present disclosure do not denote any order, quantity, or importance, but are merely used to distinguish different components from each other.

Furthermore, in the description of the embodiments of the present disclosure, the term "coupled with" or "coupled electronically to" may mean that two components are directly coupled, or that two components are coupled via one or more other components. In addition, the two components may be connected or coupled by wire or wirelessly.

Further, in the description of the embodiments of the present disclosure, the terms "first level" and "second level" are only used to distinguish magnitudes of the two levels from each other. For example, the following description will be made by taking the "first level" as a low level and the "second level" as a high level. It can be understood by those skilled in the art that the present disclosure is not limited thereto.

Transistors used in the embodiments of the present disclosure may all be thin film transistors or field effect transistors or other devices having the same characteristics. Preferably, the thin film transistors used in the embodiments of the present disclosure may be oxide semiconductor transistors. As a source and a drain of a thin film transistor used here are symmetrical, the source and the drain thereof are interchangeable. In the embodiments of the present disclosure, one of the source and the drain is referred to as a first electrode, and the other of the source and the drain is referred to as a second electrode. In the following examples, an N-type thin film transistor is taken as an example for illustration. It can be understood by those skilled in the art that the embodiments of the present disclosure are clearly applicable to a case of P-type thin film transistors.

FIG. 1 illustrates a block diagram of a shift register according to an embodiment of the present disclosure. As shown in FIG. 1, the shift register according to the embodiment of the present disclosure may comprise an input circuit 10, a pull-up circuit 20, a pull-down circuit 30, a pull-down control circuit 40, a first de-noising circuit 50, and a compensation circuit 60.

Here, the input circuit 10 is coupled electronically to a signal input terminal IN and a pull-up node PU, and the input circuit 10 is configured to apply a voltage at the signal input terminal IN to the pull-up node PU under a control of an input signal provided by the signal input terminal IN. The pull-up circuit 20 is coupled electronically to the pull-up node PU, a first clock signal terminal Clock1 and a signal output terminal OUTN, and the pull-up circuit 20 is configured to apply a voltage at the first clock signal terminal Clock1 to the signal output terminal OUTN under a control of a voltage at the pull-up node PU. The pull-down circuit 30 is coupled electronically to a reset signal terminal Reset, a first voltage signal terminal Vss, the pull-up node PU and the signal output terminal OUTN, and the pull-down circuit 30 is configured to apply a voltage at the first voltage signal terminal Vss to the signal output terminal OUTN and the pull-up node PU under a control of a voltage at the reset signal terminal Reset. The pull-down control circuit 40 is coupled electronically to a second clock signal terminal Clock2, the pull-up node PU, the pull-down node PD and the first voltage signal terminal Vss, and the pull-down control circuit 40 is configured to apply a voltage at the second clock signal terminal Clock2 to the pull-down node PD under a control of a clock signal provided by the second clock signal terminal Clock2, and apply the voltage at the first voltage signal terminal Vss to the pull-down node PD under the control of the voltage at the pull-up node PU. The first de-noising circuit 50 is coupled electronically to the pull-up node PU, the signal input terminal IN, the first voltage signal terminal Vss, the output signal terminal OUTN, and a compensation node COM, and the first de-noising circuit 50 is configured to perform de-noising processing on an output signal at the signal output terminal OUTN. The compensation circuit 60 is coupled electronically to the first clock signal terminal Clock1, the second clock signal terminal Clock2, the compensation node COM, and the first voltage signal terminal Vss, and the compensation circuit 60 is configured to simulate a drift of a threshold voltage for a transistor in the first de-noising circuit 50 according to clock signals provided by the first clock signal terminal Clock1 and the second clock signal terminal Clock2, so as to compensate for the threshold voltage of the transistor in the first de-noising circuit 50, so that the first de-noising circuit 50 continuously de-noises the output signal at the signal output terminal OUTN.

Figure 2:
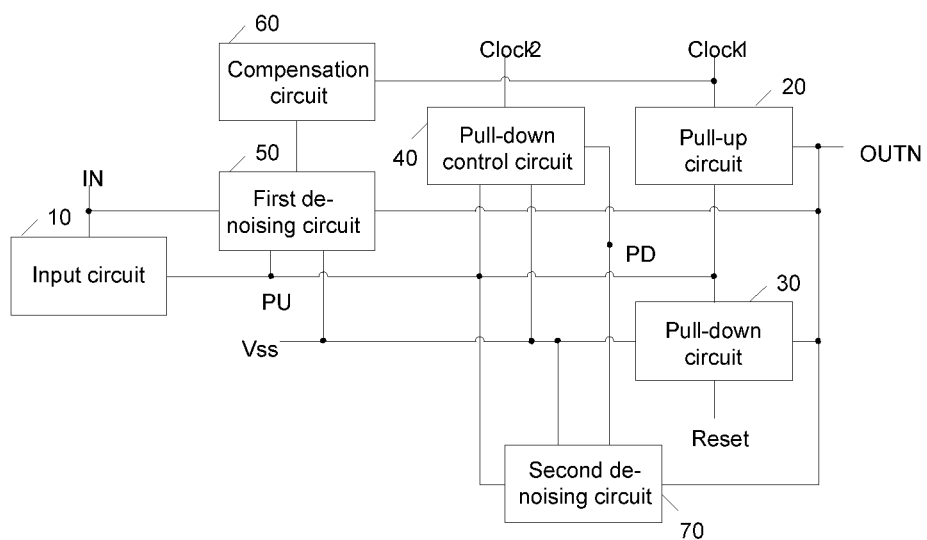
FIG. 2 illustrates a block diagram of a shift register according to one of embodiments of the present disclosure.

As shown in FIG. 2, the shift register according to the embodiment of the present disclosure may further comprise a second de-noising circuit 70 coupled electronically to the pull-down node PD, the pull-up node PU, the first voltage signal terminal Vss, and the signal output terminal OUTN. The second de-noising circuit 70 is configured to de-noise the output signal at the signal output terminal OUTN according to the voltage at the pull-up node PU under the control of a voltage at the pull-down node PD.

Figure 3:
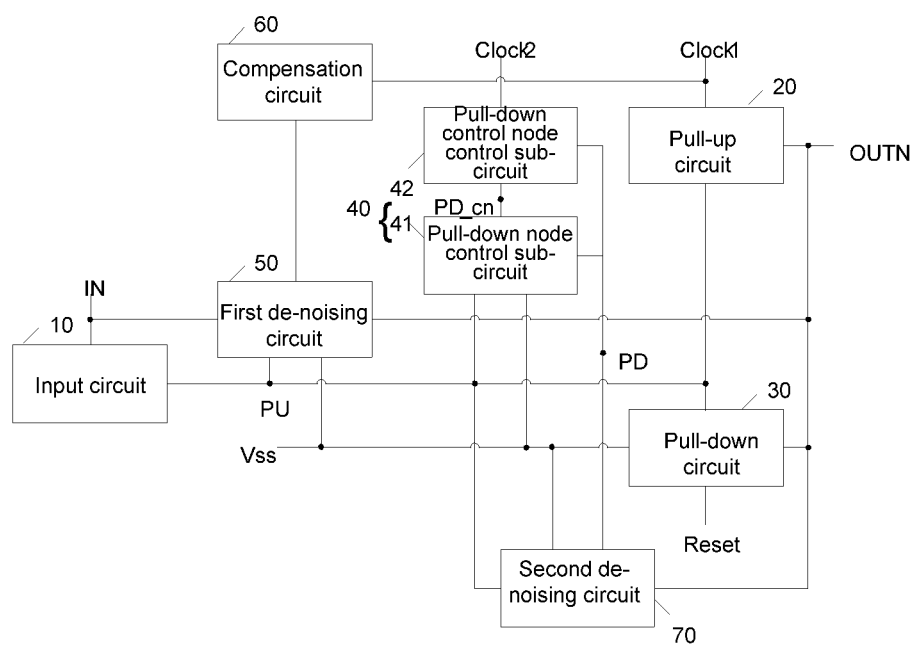
FIG. 3 illustrates a block diagram of a shift register according to another one of the embodiments of an embodiment of the present disclosure.

As shown in FIG. 3, in one of the embodiments of the present disclosure, the pull-down control circuit 40 may comprise a pull-down node control sub-circuit 41 and a pull-down control node control sub-circuit 42. The pull-down control node control sub-circuit 42 is coupled electronically to the second clock signal terminal Clock2, a pull-down control node PD_cn, and the pull-down node PD, and is configured to change a voltage at the pull-down control node PD_cn under the control of the clock signal provided by the second clock signal terminal Clock2. The pull-down node control sub-circuit 41 is coupled electronically to the pull-down control node PD_cn, the pull-up node PU, the pull-down node PD, and the first voltage signal terminal Vss, and is configured to change the voltage at the pull-down node PD under the control of the pull-up node PU and the pull-down control node PD_cn.

In one of the embodiments of the present disclosure, the shift register may comprise fifteen transistors sequentially numbered from M1 to M15 and two capacitors.

Figure 4:
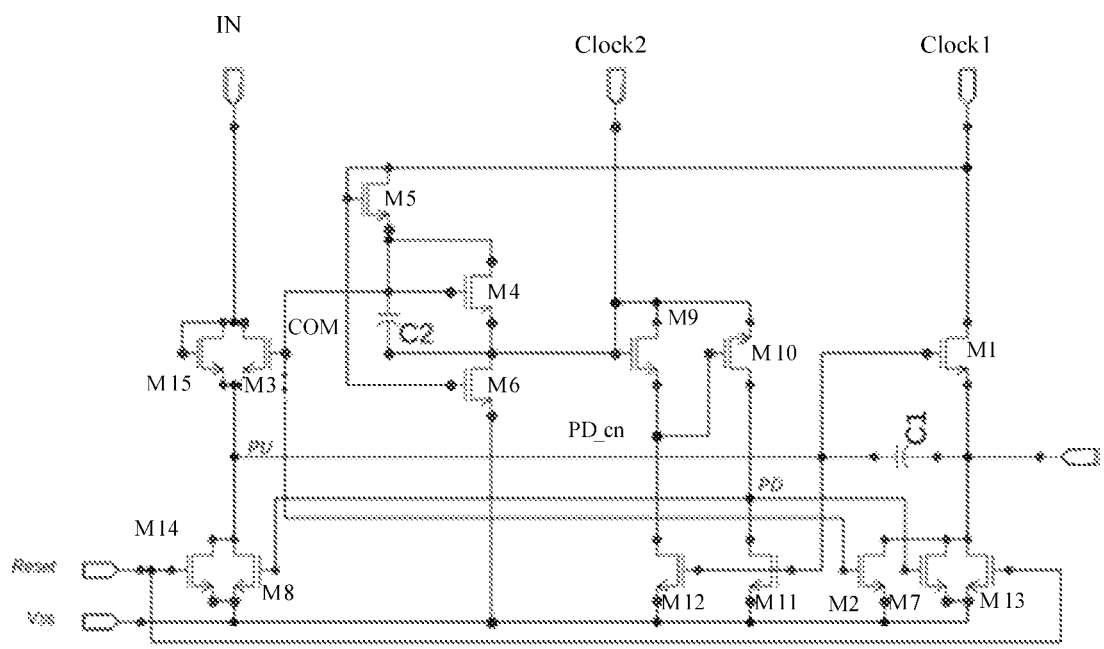
FIG. 4 illustrates a circuit structural diagram of a shift register according to one of the embodiments of the present disclosure.

As shown in FIG. 4, the pull-up circuit 20 may comprise a first transistor M1 and a first capacitor C1. Here, the first transistor M1 has a control electrode coupled electronically to the pull-up node PU, a first electrode coupled electronically to the signal output terminal OUTN, and a second electrode coupled electronically to the first clock signal terminal Clock1. The capacitor C1 has a first terminal serving as the pull-up node PU, and a second terminal coupled electronically to the signal output terminal OUTN.

The first de-noising circuit 50 may comprise a second transistor M2 and a third transistor M3. Here, the second transistor M2 has a control electrode coupled electronically to the compensation node COM, a first electrode coupled electronically to the first voltage signal terminal Vss, and a second electrode coupled electronically to the signal output terminal OUTN. The third transistor M3 has a control electrode coupled electronically to the compensation node COM, a first electrode coupled electronically to the pull-up node PU, and a second electrode coupled electronically to the signal input terminal IN.

The compensation circuit 60 may comprise a fourth transistor M4, a second capacitor C2, a fifth transistor M5, and a sixth transistor M6. Here, the fourth transistor M4 has a control electrode and a first electrode both coupled electronically to the compensation node COM, and a second electrode coupled electronically to the second clock signal terminal Clock2. The second capacitor C2 has a first terminal coupled electronically to the compensation node COM, and a second terminal coupled electronically to the second clock signal terminal Clock2. The fifth transistor M5 has a control electrode and a first electrode both coupled electronically to the first clock signal terminal Clock1, and a second electrode coupled electronically to the compensation node COM. The sixth transistor M6 has a control electrode coupled electronically to the first clock signal terminal Clock1, a first electrode coupled electronically to the first voltage signal terminal Vss, and a second electrode coupled electronically to the second clock signal terminal Clock2.

The second de-noising circuit 70 may comprise a seventh transistor M7 and an eighth transistor M8. Here, the seventh transistor M7 has a control electrode coupled electronically to the pull-down node PD, a first electrode coupled electronically to the first voltage signal terminal Vss, and a second electrode coupled electronically to the signal output terminal OUTN. The eighth transistor M8 has a control electrode coupled electronically to the pull-down node PD, a first electrode coupled electronically to the first voltage signal terminal Vss, and a second electrode coupled electronically to the pull-up node PU.

The pull-down control node control sub-circuit 42 comprises a ninth transistor M9 and a tenth transistor M10. The ninth transistor M9 has a control electrode and a first electrode both coupled electronically to the second clock signal terminal Clock2, and a second electrode coupled electronically to the pull-down control node PD_cn. The tenth transistor M10 has a control electrode coupled electronically to the pull-down control node PD_cn, a first electrode coupled electronically to the second clock signal terminal Clock2, and a second electrode coupled electronically to the pull-down node PD. The pull-down node control sub-circuit 41 comprises an eleventh transistor M11 and a twelfth transistor M12. The eleventh transistor M11 has a control electrode coupled electronically to the pull-up node PU, a first electrode coupled electronically to the first voltage signal terminal Vss, and a second electrode coupled electronically to the pull-down node PD. The twelfth transistor M12 has a control electrode coupled electronically to the pull-up node PU, a first electrode coupled electronically to the first voltage signal terminal Vss, and a second electrode coupled electronically to the pull-down control node PD_cn.

The pull-down circuit 30 may comprise a thirteenth transistor M13 and a fourteenth transistor 14. Here, the thirteenth transistor M13 has a control electrode coupled electronically to the reset signal terminal Reset, a first electrode coupled electronically to the first voltage signal terminal Vss, and a second electrode coupled electronically to the signal output terminal OUTN. The fourteenth transistor M14 has a control electrode coupled electronically to the reset signal terminal Reset, a first electrode coupled electronically to the first voltage signal terminal Vss, and a second electrode coupled electronically to the pull-up node PU.

The input circuit 10 may comprise a fifteenth transistor M15, having a control electrode coupled electronically to the signal input terminal IN, a first electrode coupled electronically to the pull-up node PU, and a second electrode coupled electronically to the control electrode of the fifteenth transistor M15.

According to another aspect of the embodiments of the present disclosure, there is provided a method for controlling a shift register, which can be applied to the shift register according to the embodiments of the present disclosure. FIG. 5A illustrates a flowchart of a method for controlling a shift register according to an embodiment of the present disclosure. As shown in FIG. 5A, the method 50 for controlling a shift register according to the embodiment of the present disclosure may comprise the following steps.

In step S501, a second capacitor in the compensation circuit is charged by the first clock signal under the control of the first clock signal, to cause the voltage at the compensation node to be a charging voltage of the second capacitor, so that a voltage applied by the compensation circuit to the first de-noising circuit is greater than a threshold voltage of the de-noising circuit.

In step S502, the second capacitor is discharged under the control of the second clock signal, until a voltage difference across the second capacitor falls to the threshold voltage.

In step S503, the voltage at the compensation node is caused to be a sum of a voltage of the first clock signal and the voltage difference across the second capacitor under the control of the first clock signal, so that the voltage applied by the compensation circuit to the first de-noising circuit is a sum of the voltage of the first clock signal and the threshold voltage.

Figure 5B:
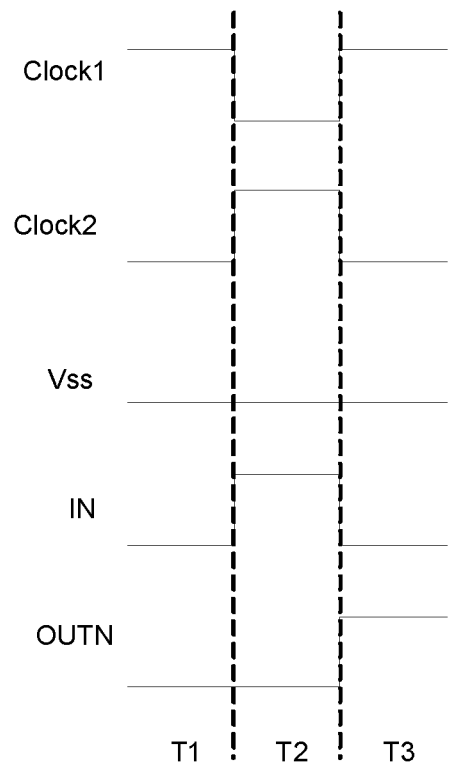
FIG. 5B illustrates a timing diagram of control signals according to an embodiment of the present disclosure.

FIG. 5B illustrates a control timing diagram of a shift register according to an embodiment of the present disclosure. Next, an operation of the shift register according to the embodiments of the present disclosure will be described in detail with reference to FIGS. 4, 5A, and 5B.

In a first phase T1, the first clock signal terminal Clock1 inputs a first level (for example, a high level), the second clock signal terminal Clock2 inputs a second level (for example, a low level), and the first voltage signal terminal Vss is at the second level. The fifth transistor M5 is turned on, and the second capacitor C2 in the compensation circuit 60 is charged by the high level input at the first clock signal terminal Clock1. A voltage at the compensation node COM is a charging voltage of the second capacitor C2, so that a voltage applied by the compensation circuit 60 to the first de-noising circuit 50 is greater than a threshold voltage Vth.

Here, channel width to length ratios of the fourth transistor M4, the fifth transistor M5, and the sixth transistor M6 are defined so that the voltage at the compensation node COM is greater than a threshold voltage Vth of the third transistor M3 in the first de-noising circuit 50 while the second capacitor C2 being charged.

In a second phase T2, the first clock signal terminal Clock1 inputs the second level, the second clock signal terminal Clock2 inputs the first level, the first voltage signal terminal Vss is at the first level, and the second capacitor C2 is discharged until a voltage difference across the second capacitor C2 falls to the threshold voltage Vth of the third transistor M3.

In a third phase T3, the first clock signal terminal Clock1 inputs the first level, the second clock signal terminal Clock2 inputs the second level, and the first voltage signal terminal Vss is at the second level. The voltage at the compensation node COM is a sum of the first level input at the first clock signal terminal Clock1 and the voltage difference across the second capacitor C2. Therefore, the voltage applied by the compensation circuit 60 to the first de-noising circuit 50 is a sum of the first level and the threshold voltage Vth, so that the threshold voltage of the third transistor M3 in the first de-noising circuit 50 can be compensated.

In combination with FIGS. 4 and 5, in the first phase T1, Clock1 provides a high potential, and Clock2 provides a low potential. At this time, gate voltages of M2, M3, M4, M5, and M6 are all at a high potential, and thus M2, M3, M4, M5, and M6 are in a turn-on state. At this time, C2 is charged by Clock1, and the channel width to length ratios of M4, M5, and M6 are adjusted, to enable the gate voltages of M2, M3 and M4 to be slightly higher than the threshold voltage Vth.

In the second phase T2, Clock1 provides a low potential, and Clock2 provides a high potential. At the moment when the high potential at Clock1 is turned off, C2 is discharged due to the action of M4, so that the voltage difference across C2 falls to the threshold voltages Vth of M2, M3, and M4.

In the compensation phase T3, Clock1 provides a high potential, Clock2 provides a low potential, and M14 is in a turn-on state. At this time, due to the action of C2, the gate potentials of M2, M3, and M4 are V1=Vclock+Vth, and a relationship between saturated output current of the TFT and the gate voltage is:

$$I_{DS}=(W/2L)C\mu(V1-Vth)^2,$$

where $I_{DS}$ is the saturated output current of the TFT, W and L are a channel width and a channel length of the TFT respectively, V1 is a gate voltage, C is capacitance of an insulating layer of the TFT per unit area, µ is a carrier mobility of the TFT, and Vth is a threshold voltage of the TFT.

Therefore, the threshold voltage of M2 and the threshold voltage of M3 may be simulated in real time by using the signal at Clock1, which realizes real-time compensation of the threshold voltage of M2 and the threshold voltage of M3, so that stable de-noising capabilities of M2 and M3 are maintained and an abnormal output condition of logical signals of the GOA due to noises is avoided, thereby achieving stable display of the display apparatus.

According to the shift register of the embodiments of the present disclosure, the drift of the threshold voltage for the transistor in the first de-noising circuit is simulated by the compensation circuit according to the clock signals provided by the first clock signal terminal and the second clock signal terminal, so as to compensate for the threshold voltage of the transistor in the first de-noising circuit, so that the first de-noising circuit can continuously de-noise the output signal at the signal output terminal, thereby ensuring a stable output of the gate driving circuit and improving the display effect of the display apparatus. In addition, the shift register has a simple structure and is easy to implement.

Figure 6:
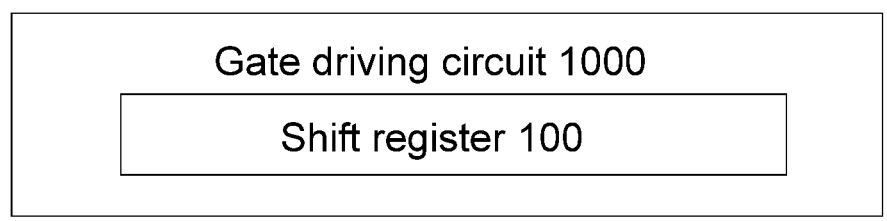
FIG. 6 illustrates a block diagram of a gate driving circuit according to an embodiment of the present disclosure.

The embodiments of the present disclosure further propose a gate driving circuit. As shown in FIG. 6, a gate driving circuit 1000 according to the embodiments of the present disclosure comprises the shift register 100 according to the above embodiments of the present disclosure. For a specific implementation, reference can be made to the above embodiments, and will not be described in detail here in order to avoid redundancy.

According to the gate driving circuit of the embodiments of the present disclosure, a stable signal output can be realized, thereby improving the display effect of the display apparatus.

The embodiments of the present disclosure further propose a display apparatus. As shown in FIG. 7, a display apparatus 10000 according to the embodiments of the present disclosure comprises the gate driving circuit 1000 according to the embodiments of the present disclosure.

According to the de-noising control method of the shift register of the embodiments of the present disclosure, in the first phase, the second capacitor in the compensation circuit is charged by adjusting the levels of the first clock signal and the second clock signal, so that the voltage applied by the compensation circuit to the first de-noising circuit is greater than the threshold voltage of the transistor; in the second phase, the second capacitor is discharged so that the voltage difference across the second capacitor is the threshold voltage; and in the third phase, the first clock signal terminal inputs the first level so that the control voltage applied by the compensation circuit to the first de-noising circuit is the sum of the first level and the threshold voltage, thereby realizing compensation of the threshold voltage of the transistor in the first de-noising circuit. Thereby, the first de-noising circuit can continuously de-noise the output signal at the signal output terminal, thereby ensuring the stable output of the gate driving circuit and improving the display effect of the display apparatus.

In the description of the present specification, the description with reference to the terms "one embodiment", "some embodiments", "example", "specific example", or "some examples" etc. means specific features, structures, materials, or characteristics described in connection with the embodiment or example are included in at least one embodiment or example of the embodiments of the present disclosure. In the present specification, schematic expression of the above terms is not necessarily directed to the same embodiment or example. Further, the specific features, structures, materials, or characteristics described may be combined in a suitable manner in any one or more embodiments or examples. In addition, different embodiments or examples described in the specification, as well as features of the different embodiments or examples, can be combined and merged by those skilled in the art in the absence of contradiction.

While the embodiments of the present disclosure have been shown and described above, it can be understood that the above embodiments are illustrative, and should not be construed as limiting the embodiments of the present disclosure. Variations, modifications, substitutions and changes of the above embodiments can be made by those of ordinary skill in the art within the scope of the embodiments of the present disclosure.

We claim:
1. A shift register, comprising:
an input circuit coupled electronically to a signal input terminal and a pull-up node, and configured to apply a voltage at the signal input terminal to the pull-up node under a control of an input signal provided by the signal input terminal;
a pull-up circuit coupled electronically to the pull-up node, a first clock signal terminal and a signal output terminal, and configured to apply a voltage at the first clock signal terminal to the signal output terminal under a control of a voltage at the pull-up node;
a pull-down circuit coupled electronically to a reset signal terminal, a first voltage signal terminal, the pull-up node, and the signal output terminal, and configured to apply a voltage at the first voltage signal terminal to the signal output terminal and the pull-up node under a control of a voltage at the reset signal terminal;
a pull-down control circuit coupled electronically to a second clock signal terminal, the pull-up node, a pull-down node, and the first voltage signal terminal, and configured to apply a voltage at the second clock signal terminal to the pull-down node under a control of a clock signal provided by the second clock signal terminal, and apply the voltage at the first voltage signal terminal to the pull-down node under the control of the voltage at the pull-up node;
a first de-noising circuit coupled electronically to the pull-up node, the signal input terminal, the first voltage signal terminal, the output signal terminal, and a compensation node, and configured to perform de-noising processing on an output signal at the signal output terminal; and
a compensation circuit coupled electronically to the first clock signal terminal, the second clock signal terminal, the compensation node, and the first voltage signal terminal, and configured to simulate a drift of a threshold voltage for a transistor in the first de-noising circuit according to clock signals provided by the first clock signal terminal and the second clock signal terminal, so as to compensate for the threshold voltage of the transistor;
the compensation circuit comprises:
a fourth transistor having a control electrode and a first electrode coupled electronically to the compensation node, and a second electrode coupled electronically to the second clock signal terminal;

a second capacitor having a first terminal coupled electronically to the compensation node, and a second terminal coupled electronically to the second clock signal terminal;

a fifth transistor having a control electrode and a first electrode coupled electronically to the first clock signal terminal, and a second electrode coupled electronically to the compensation node; and a sixth transistor having a control electrode coupled electronically to the first clock signal terminal, a first electrode coupled electronically to the first voltage signal terminal, and a second electrode coupled electronically to the second clock signal terminal.

2. The shift register according to claim 1, further comprising:

a second de-noising circuit coupled electronically to the pull-down node, the pull-up node, the first voltage signal terminal, and the signal output terminal, and configured to de-noise the output signal at the signal output terminal according to the voltage at the pull-up node under a control of a voltage at the pull-down node.

3. The shift register according to claim 1, wherein the pull-up circuit comprises:

a first transistor having a control electrode coupled electronically to the pull-up node, a first electrode coupled electronically to the signal output terminal, and a second electrode coupled electronically to the first clock signal terminal; and a first capacitor having a first terminal coupled electronically to the pull-up node, and a second terminal coupled electronically to the signal output terminal.

4. The shift register according to claim 1, wherein the first de-noising circuit comprises:

a second transistor having a control electrode coupled electronically to the compensation node, a first electrode coupled electronically to the first voltage signal terminal, and a second electrode coupled electronically to the signal output terminal; and a third transistor having a control electrode coupled electronically to the compensation node, a first electrode coupled electronically to the pull-up node, and a second electrode coupled electronically to the signal input terminal.

5. The shift register according to claim 4, wherein channel width to length ratios of the fourth transistor, the fifth transistor, and the sixth transistor are defined so that the voltage at the compensation node is greater than a threshold voltage of the second transistor and a threshold voltage of the third transistor in the first de-noising circuit while the second capacitor being charged.

6. The shift register according to claim 2, wherein the second de-noising circuit comprises:

a seventh transistor having a control electrode coupled electronically to the pull-down node, a first electrode coupled electronically to the first voltage signal terminal, and a second electrode coupled electronically to the signal output terminal; and an eighth transistor having a control electrode coupled electronically to the pull-down node, a first electrode coupled electronically to the first voltage signal terminal, and a second electrode coupled electronically to the pull-up node.

7. The shift register according to claim 1, wherein the pull-down control circuit comprises:

a ninth transistor having a control electrode and a first electrode both coupled electronically to the second clock signal terminal, and a second electrode coupled electronically to pull-down control node;

a tenth transistor having a control electrode coupled electronically to the pull-down control node, a first electrode coupled electronically to the second clock signal terminal, and a second electrode coupled electronically to the pull-down node;

an eleventh transistor having a control electrode coupled electronically to the pull-up node, a first electrode coupled electronically to the first voltage signal terminal, and a second electrode coupled electronically to the pull-down node; and a twelfth transistor having a control electrode coupled electronically to the pull-up node, a first electrode coupled electronically to the first voltage signal terminal, and a second electrode coupled electronically to the pull-down control node.

8. The shift register according to claim 1, wherein the pull-down circuit comprises:

a thirteenth transistor having a control electrode coupled electronically to the reset signal terminal, a first electrode coupled electronically to the first voltage signal terminal, and a second electrode coupled electronically to the signal output terminal; and a fourteenth transistor having a control electrode coupled electronically to the reset signal terminal, a first electrode coupled electronically to the first voltage signal terminal, and a second electrode coupled electronically to the pull-up node.

9. The shift register according to claim 1, wherein the input circuit comprises:

a fifteenth transistor having a control electrode coupled electronically to the signal input terminal, a first electrode coupled electronically to the pull-up node, and a second electrode coupled electronically to the control electrode of the fifteenth transistor.

10. A gate driving circuit, comprising the shift register according to claim 1.

11. A display apparatus, comprising the gate driving circuit according to claim 10.

12. A method for controlling the shift register according to claim 1, comprising:

charging, in a first phase, a second capacitor in the compensation circuit under a control of a first clock signal, to cause a voltage at the compensation node to be a charging voltage of the second capacitor, so that a voltage applied by the compensation circuit to the first de-noising circuit is greater than a threshold voltage of the de-noising circuit;

discharging, in a second phase, the second capacitor under a control of a second clock signal, until a voltage difference across the second capacitor falls to the threshold voltage; and causing, in a third phase, the voltage at the compensation node to be a sum of a voltage of the first clock signal and the voltage difference across the second capacitor under the control of the first clock signal, so that the voltage applied by the compensation circuit to the first de-noising circuit is a sum of the voltage of the first clock signal and the threshold voltage.

* * * * *